(12) United States Patent
Ramaraju et al.

(10) Patent No.: US 8,533,578 B2
(45) Date of Patent: Sep. 10, 2013

(54) ERROR DETECTION IN A CONTENT ADDRESSABLE MEMORY (CAM) AND METHOD OF OPERATION

(75) Inventors: Ravindraraj Ramaraju, Round Rock, TX (US); Ambica Ashok, Austin, TX (US); Kent W. Li, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 629 days.

(21) Appl. No.: 12/813,974

(22) Filed: Jun. 11, 2010

(65) Prior Publication Data

US 2011/0307769 A1 Dec. 15, 2011

(51) Int. Cl.
*G11C 29/00* (2006.01)
(52) U.S. Cl.
USPC .......................................... 714/805; 714/801
(58) Field of Classification Search
USPC .............. 714/766, 769, 767, 763, 758, 108, 714/805, 801
See application file for complete search history.

(56) References Cited

U.S. PATENT DOCUMENTS

| | | | |
|---|---|---|---|
| 6,728,124 B1 | 4/2004 | Ichiriu et al. | |
| 6,779,150 B1 * | 8/2004 | Walton et al. | 714/763 |
| 6,868,516 B1 * | 3/2005 | Walton et al. | 714/758 |
| 7,092,270 B2 | 8/2006 | Lee et al. | |
| 7,100,097 B2 | 8/2006 | Patella et al. | |
| 7,283,380 B1 | 10/2007 | Srinivasan et al. | |
| 7,296,210 B2 | 11/2007 | Driediger | |
| 7,366,829 B1 * | 4/2008 | Luttrell et al. | 711/108 |
| 7,539,921 B2 | 5/2009 | Regev et al. | |
| 7,716,416 B2 * | 5/2010 | Chiba | 711/108 |
| 7,992,071 B2 * | 8/2011 | Murin | 714/763 |
| 2011/0194325 A1 | 8/2011 | Ramaraju et al. | |

* cited by examiner

*Primary Examiner* — David Ton
(74) *Attorney, Agent, or Firm* — Joanna G. Chiu

(57) ABSTRACT

A method for accessing a content addressable memory (CAM) system having a CAM and random access memory (RAM) includes providing comparand data to the CAM, comparing the comparand data to entries of the CAM to determine a matching CAM entry and asserting a match signal corresponding to the matching CAM entry. In response to asserting the match signal, the method further includes providing output data, an output parity bit, and an output complement parity bit from the RAM, using the comparand data to generate a generated parity bit, and providing an error indicator based on the generated parity bit, the output parity bit, and the output complement parity bit. The error indicator may indicate an error when the generated parity bit is not equal to the output parity bit or when the output parity bit is equal to the output complement parity bit.

20 Claims, 4 Drawing Sheets

| PARITY BIT OF CORRECT MATCHING ENTRY | PARITYb BIT OF CORRECT MATCHING ENTRY | PARITY BIT OF INCORRECT MATCHING ENTRY | PARITYb BIT OF INCORRECT MATCHING ENTRY | GENERATED PARITY | OUTPUT PARITY BIT | OUTPUT PARITYb BIT | GENERATED PARITY BIT XOR OUTPUT PARITY BIT | GENERATED PARITY BIT XNOR OUTPUT PARITYb BIT | ERROR |
|---|---|---|---|---|---|---|---|---|---|
| 1 | 0 | 0 | 1 | 1 | 1 | 1 | 0 | 1 | 1 |
| 0 | 1 | 1 | 0 | 0 | 1 | 1 | 1 | 1 | 1 |

ERROR DETECTION IN A CONTENT ADDRESSABLE MEMORY (CAM) AND METHOD OF OPERATION

BACKGROUND

1. Field

This disclosure relates generally to a content addressable memory (CAM), and more specifically, to error detection in a CAM.

2. Related Art

As consumers demand smaller devices, the semiconductor devices within the devices also must shrink. When shrinking semiconductor devices, the bit cell area decreases, causing an increase in the possibility of a soft error rate induced failures. Soft errors can occur, for example, when external energy (such as due to alpha particle bombardment) is imparted onto the circuit, causing bit values in the CAM to change. These soft errors may result in multiple hit errors. Therefore, as CAM geometries continue to shrink, error detection becomes increasingly important.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 3 is a truth table illustrating the operation of the memory system in accordance with an embodiment.

DETAILED DESCRIPTION

In a memory system having a CAM and a RAM, it is desirable to detect multiple-hit errors (due, for example, to single bit errors). For example, in a CAM-RAM memory system, the parity bits for the CAM entries are stored in a corresponding RAM entry. In one embodiment, both the parity bits and the complement parity (parityb) bits are stored in each corresponding RAM entry. By storing both the parity bits and the complement parity bits in the RAM and using both to detect an error, multiple hit errors due to single bit errors in the CAM, many of which were previously undetectable, may now be reliably detected.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
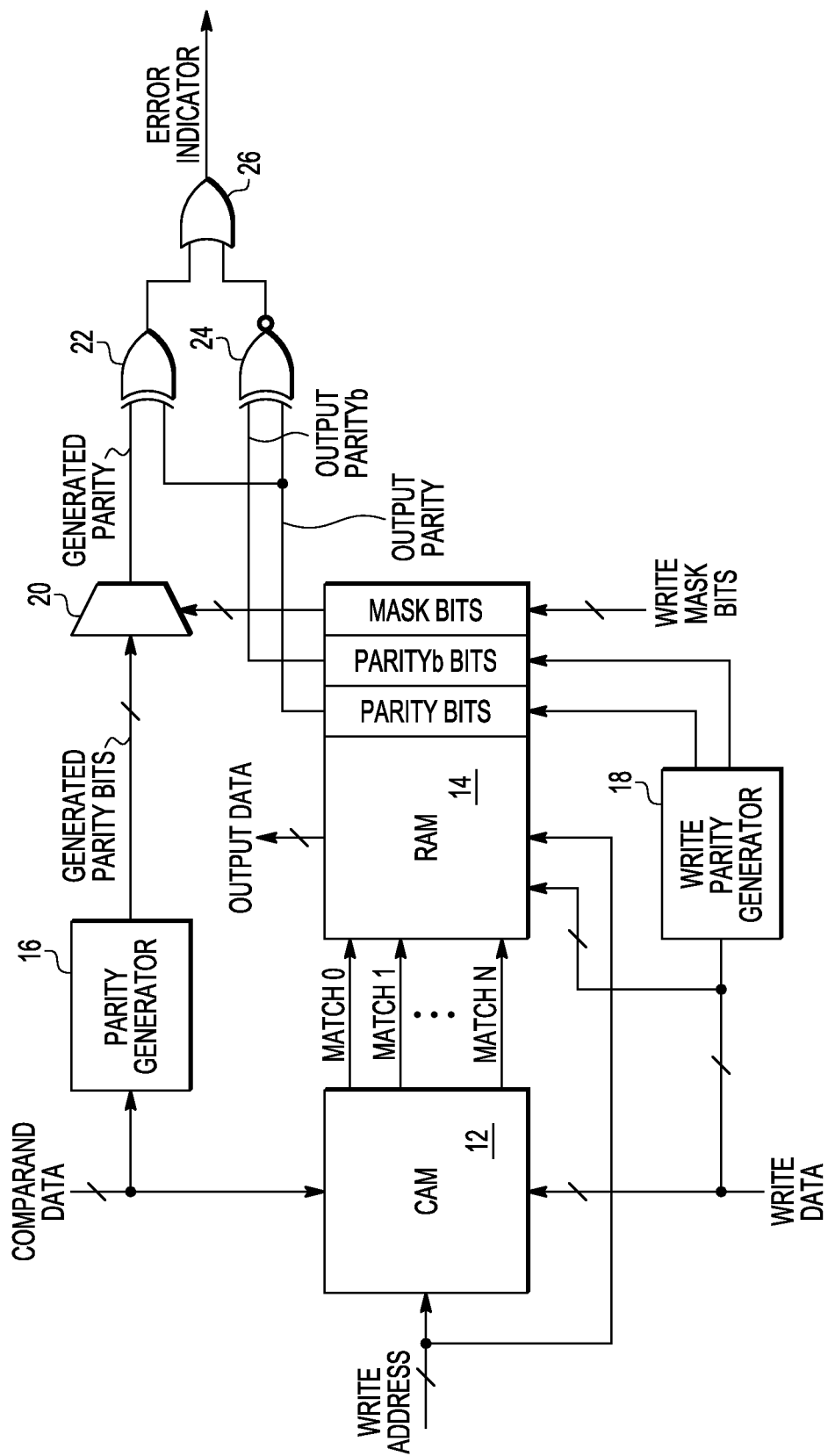
FIG. 1 illustrates a schematic of a portion of a memory system, including a CAM and RAM, in accordance with an embodiment.

FIG. 1 illustrates a memory system 10 in accordance with one embodiment of the present invention. Memory system 10 (which may also be referred to as a CAM-RAM system) includes a CAM 12, a RAM 14, a parity generator 16, a write parity generator 18, a multiplexer (MUX) 20, an exclusive OR (XOR) gate 22, an exclusive NOR (XNOR) gate 24, and an OR gate 26. CAM 12 includes N+1 entries, where each entry stores CAM data. CAM 12 provides N+1 match signals (match 0 to match N) to RAM 14. RAM 14 also includes N+1 entries, where each entry in RAM 14 receives a corresponding match signal of match 0 to N from a corresponding CAM entry. Each RAM entry stores RAM data, a parity bit, a complement parity bit (parityb bit), and one or more mask bits for the corresponding CAM entry. (Note that an "entry" of CAM 12 or RAM 14 can interchangeably be referred to as a "row" of CAM 12 or RAM 14.) Comparand data is provided to both CAM 12 and parity generator 16. A write address is provided to CAM 12 and RAM 14, and corresponding write data is provided to CAM 12, RAM 14, and write parity generator 18. Write parity generator provides parity bits and parityb bits to RAM 14. Write mask bits are also provided to RAM 14. RAM 14 provides output data. Ram 14 also provides an output parityb bit to a first input of XNOR gate 24, and an output parity bit to a second input of XNOR gate 24. MUX 20 receives multiple data inputs from parity generator 16, receives a control input from the mask bits of RAM 14, and provides a generated parity bit to a first input of XOR gate 22. RAM 14 provides the output parity bit to a second input of XOR gate 22. An output of XOR gate 22 is coupled to a first input of OR gate 26, and an output of XNOR gate 24 is provided to a second input of OR gate 26. An output of OR gate 26 provides an error indicator. Note that gates 22, 24, and 26 can be referred to as error detection logic, in which error detection logic provides the error indicator signal.

Figure 2:
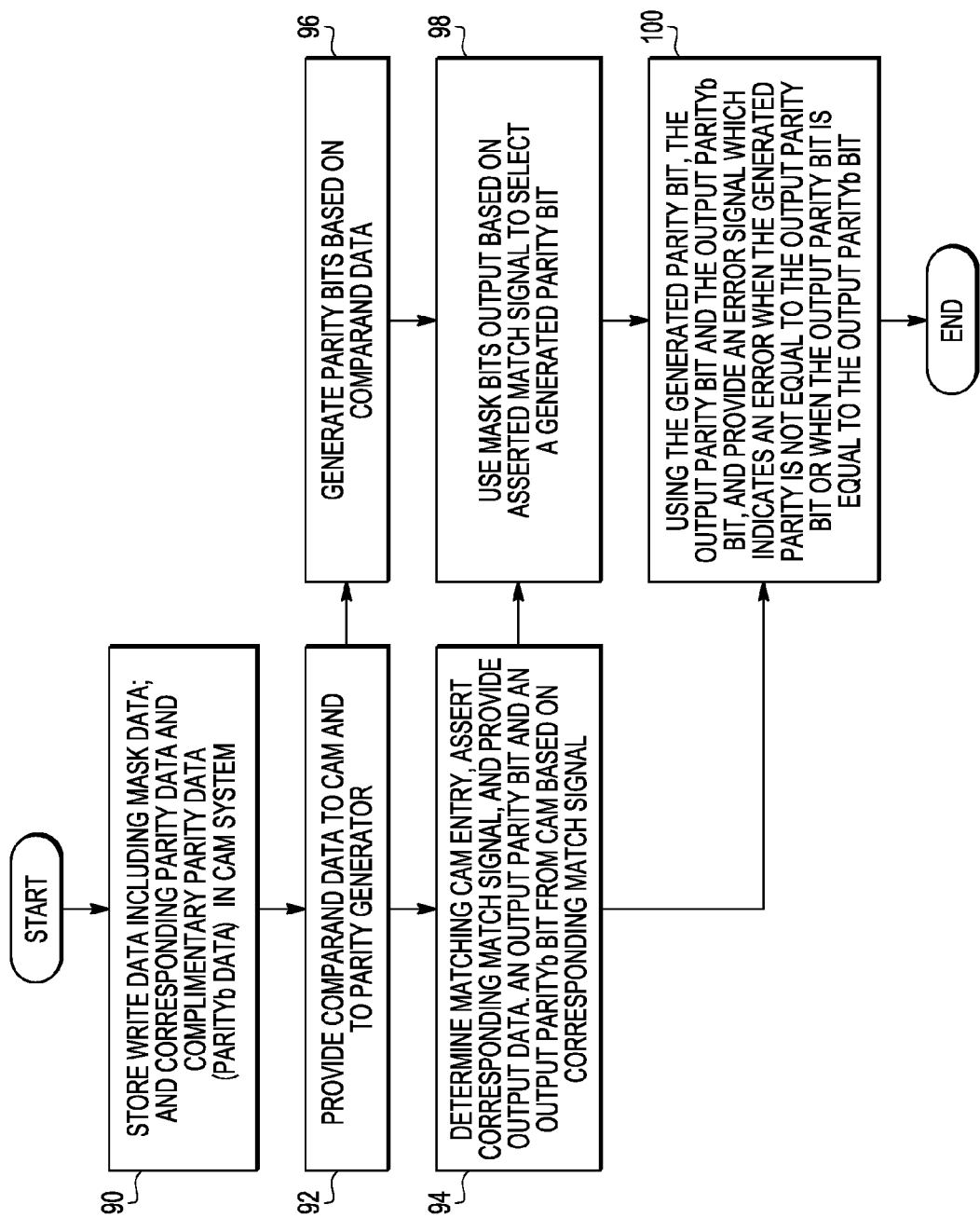
FIG. 2 illustrates a flow diagram for accessing a memory system, such as the memory system of FIG. 1, in accordance with an embodiment.

In operation, memory system 10 can both be written to and read from and will be described further in reference to the flow diagram of FIG. 2. Referring to FIG. 2, flow begins with a write operation in block 90 in which write data, including mask data and corresponding parity data and complementary parity data (parityb data), is stored in memory system 10. For example, referring back to FIG. 1, a write address is provided to CAM 12 and RAM 14 and corresponding write data is provided to CAM 12 and RAM 14. In one embodiment, a portion of the write data is stored as CAM data to an entry in CAM 12 selected based on the write address, and another portion of the write data is stored as RAM data in RAM 14 at an entry which corresponds to the selected entry in CAM 12.

Alternatively, all of the write data may be stored in RAM 14 at the entry which corresponds to the selected entry in CAM 12. Also, the write data is provided to write parity generator 18 such that the appropriate parity and complementary parity bit for the entry may be calculated and provided to the parity bits portion and parityb bits portion of RAM 14. The parity bit and parityb bit generated for the write is stored in the same entry of RAM 14 as the corresponding RAM data. That is, each entry in RAM 14 stores RAM data, a parity bit, a parityb bit, and one or more mask bits for the corresponding entry in CAM 12. Note that the one or more mask bits may be generated as known in the art and may be provided via write mask bits to the mask bits portion of RAM 14 during a write to memory system 10. Alternatively, they may be provided as part of the write data. These one or more mask bits may indicate, for example, which subset of the write data is used to generated the parity and parityb bits to be stored in RAM 14. Alternatively, no mask bits may be used or stored in RAM 14. In this case, for example, all bits of the write data may be used to determine the parity bit and parityb bit to be stored in RAM 14.

Referring back to FIG. 2, flow proceeds from block 90 to block 92 in which a read operation commences. In block 92, comparand data for a read operation is provided to the CAM and parity generator. For example, referring to FIG. 1, when comparand data is received by system 10, system 10 provides the comparand data to CAM 12 and parity generator 16. Flow then proceeds to block 94 in which a matching CAM entry is determined, the corresponding match signal is asserted, and the output data, output parity bit, and output parityb bit corresponding to the asserted match signal are provided from the RAM. For example, referring to FIG. 1, system 10 determines if the comparand data matches any valid entries of CAM 12. (Note that the compare circuitry for determining if the comparand data matches any valid entries of CAM 12 is known in the art and thus will not be described in more detail herein.) If the comparand data matches a valid entry, then the corresponding match signal is asserted to indicate a match (or hit) of that entry. Note that, although not illustrated in FIG. 1, each entry of CAM 12 may also include a valid bit, such that a hit of a particular entry occurs when the CAM data of that particular entry matches the received comparand data and that particular entry is marked as valid. For any entry which does not result in a hit, the corresponding match signal is negated. These match signals (match 0 through N) are provided to RAM 14 such that the appropriate RAM data corresponding to the matching entry is provided as output data from RAM 14. Also, the parity bit and parityb bit from the entry of RAM 14 corresponding to the asserted match signal are each provided by RAM 14 as the output parity and the output parityb, respectively (to, for example, gates 22 and 24, as will be described in more detail below). In one embodiment, all of the parity bits output by RAM 14 are dynamically ORed (or wired-ORed) to provide the output parity bit, and all of the parityb bits output by RAM 14 are dynamically ORed (or wired-ORed) to provide the output parityb bit.

Referring back to FIG. 2, flow also proceeds from block 92 to block 96 in which parity bits are generated based on the comparand data. For example, the comparand data is provided to parity generator 16 which generates read parity bits which are provided to MUX 20. Flow proceeds from block 96 to block 98 (in which information from block 94 is also used) in which mask bits output by RAM 14 based on the asserted match signal are used to select a generated parity bit output by parity generator 16. For example, the mask bits of the entry in RAM 14 which correspond to the matching entry of CAM 12 are provided to a control input of MUX 20 and used to select the appropriate parity bit from the generated read parity bits. Therefore, MUX 20 outputs the appropriate generated parity bit (generated by parity generator 16) to logic gate 22. For example, in one embodiment, for each received comparand data, parity generator 16 generates multiple parity bits, each parity bit corresponding to the use of a different subset of the received comparand data to generate the parity bit. Therefore, based on the mask bits for the matching entry from RAM 14, the correct generated parity of the multiple generated parity bits can be selected. Alternatively, as mentioned above, RAM 14 may not store mask bits and no mask bits may be used. In this case, MUX 20 may not be present and parity generator 16 outputs the generated parity bit directly to logic gate 22. In this case, all bits of the comparand data may be used to generate the generated parity.

Flow then proceeds from blocks 94 and 98 to block 100 in which the generated parity bit, the output parity bit, and the output parityb bit are used to provide an error signal which indicates an error when the generated parity is not equal to the output parity bit or when the output parity bit is equal to the output parityb bit. For example, in FIG. 1, error detection logic (including, for example, gates 22, 24, and 26) is used to determine whether or not an error is indicated and the error indicator signal is provided accordingly. In one embodiment, the error indicator signal is described by the expression "(generated parity bit XOR output parity bit) OR (output parityb bit XNOR output parity bit)." Therefore, in one embodiment, XOR gate 22 provides "generated parity bit XOR output parity bit" to OR gate 26, XNOR gate 24 provides "output parityb bit XNOR output parity bit", and OR gate 26 provides the logical OR of the two bit inputs from gates 22 and 24 to provide the error indicator. In the current example of FIG. 1, when error indicator is asserted (i.e. a logic level one), an error is indicated, and when error indicator is negated (i.e. a logic level zero), an error is not indicated. In one embodiment, the error indicator signal indicates an error when the generated parity bit is not equal to the output parity bit or when the output parity bit is equal to the output complement parity bit. Note that any combination of logic can be used to generate the error indicator signal, in which FIG. 1 provides one example of the error detection logic which may be used. Also, note that the error indicator is provided based not only on the generated parity bit from parity generator 16 and the output parity bit from RAM 14, but it is based on the generated parity bit from parity generator 16, the output parity bit from RAM 14, and the output parityb bit from RAM 14. That is, by including the output parityb bit from RAM 14, an improved error determination can be made, as will be described in more detail below.

Note that, in one embodiment, each valid entry of CAM 12 should have a unique entry such that each received comparand data only results in one hit (i.e. in one match). However, due to errors (such as soft errors described above) in the entries of CAM 12 (such as, for example, single-bit errors in the entries), it may be possible for more than one entry of CAM 12 to result in a hit within CAM 12. With the error indicator described in reference to FIGS. 1 and 2 which is generated based on the generated parity bit, the output parity bit, and the output complement parity bit, such multiple hit errors can be detected. Through the use of the complement parity bit as well as the parity bit, erroneous hits can be reliably detected, even with an OR compression/reduction of the results. For example, in many current CAM-RAM systems, all parity bits in a column output by the RAM are dynamically ORed. However, in these current CAM-RAM systems, many multiple hit errors (errors resulting from hitting multiple entries in the CAM) cannot be reliably detected. For example, if the generated parity of the input comparand data is a "1," and the input comparand data, due to a single bit error, actually results in two matches, the parity of one of the matching entries will be a "1" and the other a "0" (since it is a single bit error). Therefore, the output parity will also be a "1" since all the parity bits are ORed together (prior to comparison with the generated parity). That is, as long as one matching entry provides a parity of "1", the output parity will be "1". In this case, the output parity of "1" matches the generated parity of "1" and thus a multiple hit error would not be detected, even though one occurred. This is in contrast to memory system 10 of FIG. 1, in which the multiple hit error, in this example, would be detected through the use of the generated parity bit, the output parity bit, and the output parityb bit, as will be described in further detail with respect to the example of FIG. 3.

FIG. 3 illustrates a truth table showing two examples which result in a multiple hit error being detected (and thus resulting in the assertion of the error indicator). The truth table of FIG. 3 includes a first example 102 and a second example 104. In each of examples 102 and 104, it is assumed that the received comparand data matches with a correct matching entry of CAM 12 as well as an incorrect matching entry of CAM 12. That is, the received comparand data results in two matches in CAM 12, due, for example, to a single bit error in the incorrect matching entry of CAM 12. Since each entry in CAM 12 is expected to be unique, only one matching entry (i.e. the correct matching entry) should be identified and only one corresponding match signal asserted to RAM 14. However, due to a single bit error, a second entry (i.e. an incorrect matching entry) in CAM 12 may also match and thus result in a second match signal being asserted to RAM 14. In this situation, an error should be detected since a match of multiple entries should not occur.

In example 102, it is assumed that the parity bit of the correct matching entry in CAM 12 is a logic level one, and the complement parity (parityb) bit of the correct matching entry in CAM 12 is a logic level zero. Note that the parity and parityb bits of the correct matching entry are stored in an entry of RAM 14 corresponding to the correct matching entry in CAM 12. In example 102, it is also assumed that the parity bit of the incorrect matching entry is a logic level zero and the complement parity (parityb) bit of the incorrect matching entry is a logic level one. Note that the parity and parityb bits of the incorrect matching entry are stored in an entry of RAM 14 corresponding to the incorrect matching entry in CAM 12. For example 102, it is also assumed that the generated parity (i.e. the parity generated from the received comparand data and selected by the mask bits, if mask bits are used) is a logic level one. The output parity bit from RAM 14 would therefore be a logic level one (the result of dynamically ORing all the parity bits of RAM 14). That is, due to the presence of the logic level one of the parity bit of the correct matching entry, the output parity bit is a logic level one. The output parityb bit from RAM 14 would be a logic level one as well (the result of dynamically ORing all the parityb bits of RAM 14). Due to the presence of the logic level one of the parityb bit of the incorrect matching entry, the output parityb bit is a logic level one. The generated parity bit XORed with the output parity bit (output, for example, by XOR gate 22) is a logic level zero, and the output parity bit XNORed with the output parityb bit (output, for example, by XNOR gate 24) is a logic level one. Therefore, the error indicator, produced by ORing the outputs of logic gates 22 and 24, is a logic level one, correctly indicating occurrence of a multiple hit error. That is, as described above, the error indicator indicates an error when the generated parity bit is not equal to the output parity bit or when the output parity bit is equal to the output complement parity bit.

In example 102, although the generated parity bit is equal to the output parity bit, the output parity bit is also equal to the output complement parity bit, which results in the indication of an error.

Note that in a typical CAM system available today, the output parity bit would be exclusively ORed with the generated parity bit to determine whether an error is present. If the output parity bit differs from the generated parity bit, an error is indicated; otherwise, if the output parity bit is the same as the generated parity it, no error is indicated. Therefore, in example 102, since the generated parity bit matches the output parity bit, no error would be indicated. However, this is incorrect since multiple hits did occur. Therefore, through the use of both the output parity bit and the output parityb bit, both output by RAM 14, a more reliable error indicator may be provided.

In example 104, it is assumed that the parity bit of the correct matching entry in CAM 12 is a logic level zero, and the complement parity (parityb) bit of the correct matching entry in CAM 12 is a logic level one. Note that the parity and parityb bits of the correct matching entry are stored in an entry of RAM 14 corresponding to the correct matching entry in CAM 12. In example 104, it is also assumed that the parity bit of the incorrect matching entry is a logic level one and the complement parity (parityb) bit of the incorrect matching entry is a logic level zero. Note that the parity and parityb bits of the incorrect matching entry are stored in an entry of RAM 14 corresponding to the incorrect matching entry in CAM 12. For example 104, it is also assumed that the generated parity (i.e. the parity generated from the received comparand data and selected by the mask bits, if mask bits are used) is a logic level zero. The output parity bit from RAM 14 would therefore be a logic level one (the result of dynamically ORing all the parity bits of RAM 14). That is, due to the presence of the logic level one of the parity bit of the incorrect matching entry, the output parity bit is a logic level one. The output parityb bit from RAM 14 would be a logic level one as well (the result of dynamically ORing all the parityb bits of RAM 14). Due to the presence of the logic level one of the parityb bit of the correct matching entry, the output parityb bit is a logic level one. The generated parity bit XORed with the output parity bit (output, for example, by XOR gate 22) is a logic level one, and the output parity bit XNORed with the output parityb bit (output, for example, by XNOR gate 24) is also a logic level one. Therefore, the error indicator, produced by ORing the outputs of logic gates 22 and 24, is a logic level one, correctly indicating occurrence of a multiple hit error. That is, as described above, the error indicator indicates an error when the generated parity bit is not equal to the output parity bit or when the output parity bit is equal to the output complement parity bit. In example 104, both the generated parity bit is not equal to the output parity bit and the output parity bit is equal to the output complement parity bit, which results in the indication of an error.

Figure 4:
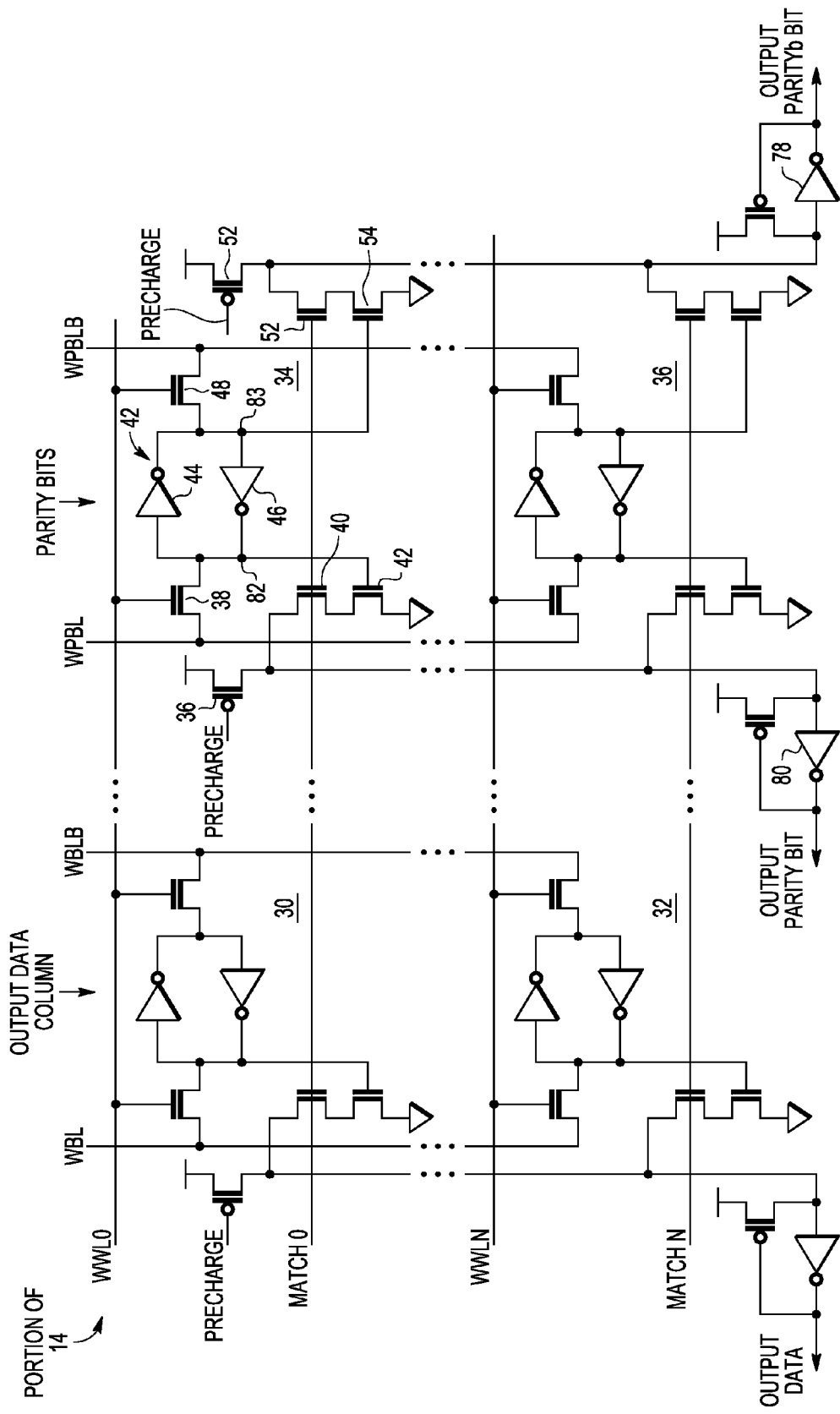
FIG. 4 illustrates, in schematic form, a portion of the RAM of FIG. 1 in accordance with an embodiment.

FIG. 4 illustrates, in schematic form, a portion of RAM 14 in accordance with an embodiment of the present invention. In the example of FIG. 4, RAM 14 includes an array of memory cells, such as cells 30 and 32, which store the RAM data. For example, FIG. 4 illustrates an example of an output data column which includes cells 30 and 32. Cell 30 is included, for example, in a first row of RAM 14, which receives the match 0 signal from CAM 12 and cell 32 is included, for example, in a last row of RAM 14, which receives the match N signal from CAM 12. The rows of RAM 14 can include any number of memory cells, as needed, to store the RAM data. Also, as known in the art, each RAM data bitcell for the RAM data includes cross coupled inverters which are capable of storing a single bit value. Each RAM data bitcell also includes selection transistors connected between the cross coupled inverters and corresponding bit lines and whose control terminals are coupled to the corresponding wordline. Each row of RAM 14 also includes a parity bitcell. For example, the first row includes RAM data bitcell 30 and parity bitcell 34 and the last row includes RAM data bitcell 32 and parity bitcell 36.

In the illustrated embodiment, each parity bitcell stores and provides both the parity bit and the complement (parityb) bit. Parity bitcell 34 includes cross coupled inverters 42, which includes a first inverter 44 and a second inverter 46, in which an output of inverter 44 is connected to an input of inverter 46 and an output of inverter 46 is connected to an input of inverter 44. An n-channel transistor 38 has a first current electrode connected to a corresponding bitline, WPBL, a second current electrode connected to the input of inverter 44, and a control electrode connected to a corresponding word line (of the first row), WWL0. An n-channel transistor 48 has a first current electrode connected to an output of inverter 44, a second current electrode connected to a corresponding complementary bitline, WPBLB, and a control electrode connected to the corresponding word line of the first row, WWL0. A circuit node 82 at the input of inverter 44 provides the bit value for the parity bit and a circuit node 83 at the output of inverter 44 provides the bit value for the parityb bit. That is, each parity bitcell, such as parity bitcell 34, provides both the stored parity bit value and the stored parityb bit value. A p-channel transistor 36 has a first current electrode connected to a first voltage supply terminal (e.g. a Vdd terminal), a second current electrode connected to a circuit node 86, and a control electrode coupled to receive a precharge signal (which, in the illustrated embodiment, is a negative logic signal such that, when asserted, it is a logic level zero, and when negated, it is a logic level one). A p-channel transistor 50 has a first current electrode connected to the first voltage supply terminal, a second current electrode connected to a circuit node 76, and a control electrode coupled to receive the precharge signal. An n-channel transistor 40 has a first current electrode connected to node 86, a control electrode coupled to receive match 0, and a second current electrode. An n-channel transistor 42 has a first current electrode connected to the second current electrode of transistor 40, a control electrode connected to node 82, and a second current electrode connected to a second voltage supply terminal (e.g. a Vss terminal). An n-channel transistor 52 has a first current electrode connected to node 76, a control electrode coupled to receive match 0, and a second current electrode. An n-channel transistor 54 has a first current electrode connected to the second current electrode of transistor 52, a control electrode connected to node 83, and a second current electrode connected to the second voltage supply terminal.

In operation, in response to assertion of the precharge signal to a logic level zero (which is provided to all the bitcells of RAM 14, including both the RAM data bitcells and parity bitcells), the bitcells of RAM 14 are precharged. For example, referring to parity bitcell 34, in response to assertion of the precharge signal to a logic level 0, transistors 36 and 50 are turned on, thus precharging nodes 86 and 76, respectively. After precharging, the precharge signal is deasserted to a logic level one, thus allowing the parity portion of the parity bitcells to control node 86 and the parityb portion of the parity bitcells to control node 76. Therefore, the parity outputs of the parity bitcells are dynamically ORed and the result is provided through inverter 80 as the output parity bit. Similarly, the parityb outputs of the parity bitcells are dynamically ORed and the result is provided through inverter 78 as the output parityb bit.

In operation, when accessing memory system 10 and a match signal is asserted, the corresponding row of RAM 14 is selected. For example, when match 0 is asserted, the bitcells in the first row (including bitcells 30 and 34) are selected. The corresponding bitlines and complementary bitlines (such as WBL, WBLB, WPBL, and WPBLB) are set to their appropriate values such that the bit values from the RAM data bitcells of the selected row can be used to provide the output data, the bit value (corresponding to one side of the cross coupled inverter, such as node 82) from the parity bitcell of the selected row can be used to provide the output parity bit via inverter 80, and the bit value (corresponding to the other side of the cross coupled inverter, such as node 83) from the parity bitcell of the selected row can be used to provide the output parityb bit via inverter 78. When parity bitcell 34 is selected, such as by assertion of match 0, n-channel transistors 40 and 52 are turned on, and the value at node 82 controls whether n-channel transistor 42 is on or off and the value at node 83 controls whether n-channel transistor 54 is on or off. Therefore, the value at node 86 is affected by the value in parity bitcell 34. If transistor 42 is on due to a logic level one at node 82, then node 86 is pulled to a logic level low and the output parity bit is a logic level one. If transistor 42 is off due to a logic level zero at node 82, then, so long as no other parity bitcells in the column pull node 86 to a logic level low, node 86 remains a logic level high and the output parity bit is a logic level zero. Therefore, note that each of the output parity bit and the output parityb bit are provided as a result of a wired-OR operation (i.e. a dynamic OR operation). Note also that for each column of RAM data bitcells, the output data bit for that column is also provided as a result of a wired-OR operation.

In the current example of FIG. 4, the parity and parityb bits are stored in the same cell in which different nodes of the cross coupled inverters are used to provide the parity and parityb values. In this manner, improved reliability may be achieved. For example, if there is an error with any of the parity bitcells, both the parity and parityb values will be affected in the same manner. Also, since each parity and parityb bit share the same parity bitcell, it is less likely that an error will be present with the parity and parityb bits. However, in alternate embodiments, a second column of parity bitcells may be used such that one column of the parity bitcells provides the parity bits and the other column provides the parityb bits.

By now it should be appreciated that there has been provided a CAM-RAM system in which multiple hit errors due, for example, to single bit errors can be reliably detected. For example, through the storing of the complement parity bits as well as the parity bits, and using the complement parity bits as well as the parity bits in generating an error indicator, multiple hit errors may be more reliably detected.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different CAM system architectures. For example, although FIG. 1 and the discussion thereof describe an exemplary CAM system, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Also, different circuitry may be used to perform the logic functions described, for example, in reference to the erroneous hit detection circuitries 18 and 118. Thus, it is to be understood that the architectures and circuitry depicted herein are merely exemplary, and that in fact many other architectures or circuitry can be implemented which achieve the same functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments. Also, some operations may occur concurrently or serially.

Although the invention is described herein with reference to specific embodiments, various modifications and changes can be made without departing from the scope of the present invention as set forth in the claims below. For example, masking may or may not be used within the CAM system, or other types of error detection other than parity may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method for accessing a content addressable memory (CAM) system having a CAM and random access memory (RAM) including providing comparand data to the CAM; comparing the comparand data to entries of the CAM to determine a matching CAM entry and asserting a match signal corresponding to the matching CAM entry; in response to asserting the match signal, providing output data, an output parity bit, and an output complement parity bit from the RAM; using the comparand data to generate a generated parity bit; and providing an error indicator based on the generated parity bit, the output parity bit, and the output complement parity bit. Item 2 includes the method of item 1, wherein the error indicator indicates an error when the generated parity bit is not equal to the output parity bit or when the output parity bit is equal to the output complement parity bit. Item 3 includes the method of item 1, and further includes in response to asserting the match signal, providing mask data from the RAM, wherein the using the comparand data to generate a generated parity bit comprises using the comparand data and the mask data to generate the generated parity bit. Item 4 includes the method of item 1, and further includes storing write data and corresponding parity data and complement parity data to the CAM system. Item 5 includes the method of item 4, wherein a first portion of the write data is stored in the CAM, a second portion of the write data is stored in the RAM, and the corresponding parity data and complement parity data are stored in the RAM. Item 6 includes the method of item 5, wherein the corresponding parity data and the complement parity data are stored in a same bitcell of the RAM. Item 7 includes the method of item 4, wherein the corresponding parity data and the complement parity data are stored in a same bitcell of the RAM. Item 8 includes the method of item 1, wherein each of the output data, the output parity bit and the output complement parity bit is provided as a result of a wired-OR operation. Item 9 includes the method of item 1, wherein when the step of comparing the comparand data to entries of the CAM to determine the matching CAM entry results in asserting the match signal corresponding to the matching CAM entry and asserting a second match signal corresponding to an incorrect matching CAM entry, the error signal indicates an error based on the generated parity bit, the output parity bit, and the output complement parity bit. Item 10 includes the method of item 9, wherein a first parity bit stored in a first RAM entry corresponding to the matching CAM entry is a logic level one and a second parity bit stored in a second RAM entry corresponding to the incorrect matching CAM entry is a logic level zero. Item 11 includes the method of item 10, wherein the output parity bit is provided from the RAM as a logical ORing of at least the first parity bit and the second parity bit.

Item 12 includes a method for accessing a content addressable memory (CAM) system having a CAM and random access memory (RAM) including storing write data and corresponding parity data and complement parity data to the CAM system, wherein a first portion of the write data is stored in the CAM, a second portion of the write data is stored in the RAM, and the corresponding parity data and complement parity data are stored in the RAM; providing comparand data to the CAM; comparing the comparand data to entries of the CAM to determine a matching CAM entry and asserting a match signal corresponding to the matching CAM entry; in response to asserting the match signal, providing output data, an output parity bit, and an output complement parity bit from the RAM; using the comparand data to generate a generated parity bit; and providing an error indicator based on the generated parity bit, the output parity bit, and the output complement parity bit wherein the error indicator indicates an error when the generated parity bit is not equal to the output parity bit or when the output parity bit is equal to the output complement parity bit. Item 13 includes the method of item 12, and further includes in response to asserting the match signal, providing mask data from the RAM, wherein the using the comparand data to generate a generated parity bit comprises using the comparand data and the mask data to generate the generated parity bit. Item 14 includes the method of item 12, wherein the corresponding parity data and the complement parity data are stored in a same bitcell of the RAM. Item 15 includes the method of item 12, wherein when the step of comparing the comparand data to entries of the CAM to determine the matching CAM entry results in asserting the match signal corresponding to the matching CAM entry and asserting a second match signal corresponding to an incorrect matching CAM entry, the error signal indicates the error. Item 16 includes the method of item 15, wherein a first parity bit stored in a first RAM entry corresponding to the matching CAM entry is a logic level one and a second parity bit stored in a second RAM entry corresponding to the incorrect matching CAM entry is a logic level zero. Item 17 includes the method of item 12, wherein each of the output data, the output parity bit and the output complement parity bit is provided as a result of a wired-OR operation.

Item 18 includes a content addressable memory (CAM) system including a CAM having a plurality of CAM entries and providing a plurality of match signals, wherein in response to receiving comparand data, the CAM compares the comparand data to the plurality of CAM entries to determine a matching CAM entry and asserts a match signal of the plurality of match signals corresponding to the matching CAM entry; a random access memory (RAM) coupled to the CAM and having a plurality of RAM entries, wherein each RAM entry corresponds to a corresponding CAM entry of the plurality of CAM entries and wherein each RAM entry stores data, a parity bit, and a complement parity bit, wherein, in response to the asserted match signal of the plurality of match signals from the CAM, the RAM provides output data, an output parity bit, and an output complement parity bit; a parity generator, wherein the parity generator uses the comparand data to generate a generated parity bit; and error detection logic coupled to the parity generator and the RAM, wherein the error detection logic indicates an error when the generated parity bit is not equal to the output parity bit or when the output parity bit is equal to the output complement parity bit. Item 19 includes the CAM system of item 18, wherein, for each RAM entry of the RAM, the parity bit and the complement parity bit are stored in a same bitcell of the RAM. Item 20 includes the CAM system of item 18, wherein each RAM entry also stores one or more mask bits, and wherein, in response to the asserted match signal, the RAM provides one or more output mask bits, and wherein the parity generator uses the one or more output mask bits and the comparand data to generate the generated parity bit.

What is claimed is:

1. A method for accessing a content addressable memory (CAM) system having a CAM and random access memory (RAM), the method comprising:
   providing comparand data to the CAM;
   comparing the comparand data to entries of the CAM to determine a matching CAM entry and asserting a match signal corresponding to the matching CAM entry;
   in response to asserting the match signal, providing output data, an output parity bit, and an output complement parity bit from the RAM;
   using the comparand data to generate a generated parity bit; and
   providing an error indicator based on the generated parity bit, the output parity bit, and the output complement parity bit.

2. The method of claim 1, wherein the error indicator indicates an error when the generated parity bit is not equal to the output parity bit or when the output parity bit is equal to the output complement parity bit.

3. The method of claim 1, further comprising:
   in response to asserting the match signal, providing mask data from the RAM, wherein the using the comparand data to generate a generated parity bit comprises using the comparand data and the mask data to generate the generated parity bit.

4. The method of claim 1, further comprising:
   storing write data and corresponding parity data and complement parity data to the CAM system.

5. The method of claim 4, wherein a first portion of the write data is stored in the CAM, a second portion of the write data is stored in the RAM, and the corresponding parity data and complement parity data are stored in the RAM.

6. The method of claim 5, wherein the corresponding parity data and the complement parity data are stored in a same bitcell of the RAM.

7. The method of claim 4, wherein the write data includes mask data.

8. The method of claim 1, wherein each of the output data, the output parity bit and the output complement parity bit is provided as a result of a wired-OR operation.

9. The method of claim 1, wherein when the step of comparing the comparand data to entries of the CAM to determine the matching CAM entry results in asserting the match signal corresponding to the matching CAM entry and asserting a second match signal corresponding to an incorrect matching CAM entry, the error signal indicates an error based on the generated parity bit, the output parity bit, and the output complement parity bit.

10. The method of claim 9, wherein a first parity bit stored in a first RAM entry corresponding to the matching CAM entry is a logic level one and a second parity bit stored in a second RAM entry corresponding to the incorrect matching CAM entry is a logic level zero.

11. The method of claim 10, wherein the output parity bit is provided from the RAM as a logical ORing of at least the first parity bit and the second parity bit.

12. A method for accessing a content addressable memory (CAM) system having a CAM and random access memory (RAM), the method comprising:
   storing write data and corresponding parity data and complement parity data to the CAM system, wherein a first portion of the write data is stored in the CAM, a second portion of the write data is stored in the RAM, and the corresponding parity data and complement parity data are stored in the RAM;
   providing comparand data to the CAM;
   comparing the comparand data to entries of the CAM to determine a matching CAM entry and asserting a match signal corresponding to the matching CAM entry;
   in response to asserting the match signal, providing output data, an output parity bit, and an output complement parity bit from the RAM;
   using the comparand data to generate a generated parity bit; and
   providing an error indicator based on the generated parity bit, the output parity bit, and the output complement parity bit wherein the error indicator indicates an error when the generated parity bit is not equal to the output parity bit or when the output parity bit is equal to the output complement parity bit.

13. The method of claim 12, further comprising:
in response to asserting the match signal, providing mask data from the RAM, wherein the using the comparand data to generate a generated parity bit comprises using the comparand data and the mask data to generate the generated parity bit.

14. The method of claim 12, wherein the corresponding parity data and the complement parity data are stored in a same bitcell of the RAM.

15. The method of claim 12, wherein when the step of comparing the comparand data to entries of the CAM to determine the matching CAM entry results in asserting the match signal corresponding to the matching CAM entry and asserting a second match signal corresponding to an incorrect matching CAM entry, the error signal indicates the error.

16. The method of claim 15, wherein a first parity bit stored in a first RAM entry corresponding to the matching CAM entry is a logic level one and a second parity bit stored in a second RAM entry corresponding to the incorrect matching CAM entry is a logic level zero.

17. The method of claim 12, wherein each of the output data, the output parity bit and the output complement parity bit is provided as a result of a wired-OR operation.

18. A content addressable memory (CAM) system, comprising:
a CAM having a plurality of CAM entries and providing a plurality of match signals, wherein in response to receiving comparand data, the CAM compares the comparand data to the plurality of CAM entries to determine a matching CAM entry and asserts a match signal of the plurality of match signals corresponding to the matching CAM entry;
a random access memory (RAM) coupled to the CAM and having a plurality of RAM entries, wherein each RAM entry corresponds to a corresponding CAM entry of the plurality of CAM entries and wherein each RAM entry stores data, a parity bit, and a complement parity bit, wherein, in response to the asserted match signal of the plurality of match signals from the CAM, the RAM provides output data, an output parity bit, and an output complement parity bit;
a parity generator, wherein the parity generator uses the comparand data to generate a generated parity bit; and
error detection logic coupled to the parity generator and the RAM, wherein the error detection logic indicates an error when the generated parity bit is not equal to the output parity bit or when the output parity bit is equal to the output complement parity bit.

19. The CAM system of claim 18, wherein, for each RAM entry of the RAM, the parity bit and the complement parity bit are stored in a same bitcell of the RAM.

20. The CAM system of claim 18, wherein each RAM entry also stores one or more mask bits, and wherein, in response to the asserted match signal, the RAM provides one or more output mask bits, and wherein the parity generator uses the one or more output mask bits and the comparand data to generate the generated parity bit.

* * * * *